United States Patent
Huang

(10) Patent No.: US 6,781,471 B2
(45) Date of Patent: Aug. 24, 2004

(54) LOW PHASE NOISE VOLTAGE CONTROLLED OSCILLATOR CIRCUIT

(75) Inventor: Tzuen-Hsi Huang, Yun-Lin Hsien (TW)

(73) Assignee: Airoha Technology Corp., Hsin-Chu (TW)

( * ) Notice: Subject to any disclaimer, the term of this patent is extended or adjusted under 35 U.S.C. 154(b) by 134 days.

(21) Appl. No.: 10/063,305

(22) Filed: Apr. 10, 2002

(65) Prior Publication Data

US 2003/0193372 A1 Oct. 16, 2003

(51) Int. Cl.[7] .................................................. H03B 5/00
(52) U.S. Cl. .............................. 331/117 R; 331/177 V
(58) Field of Search .................... 331/117 R, 177 V, 331/117 FE

(56) References Cited

U.S. PATENT DOCUMENTS

| | | | | |
|---|---|---|---|---|
| 6,469,586 B1 | * | 10/2002 | Rogers et al. | 331/117 R |
| 6,469,587 B2 | * | 10/2002 | Scoggins | 331/117 R |
| 6,545,555 B1 | * | 4/2003 | Justice et al. | 331/117 R |

* cited by examiner

Primary Examiner—Robert Pascal
Assistant Examiner—Joseph Chang
(74) Attorney, Agent, or Firm—Winston Hsu

(57) ABSTRACT

A voltage controlled oscillator (VCO) has an LC tank for generating a sinusoidal wave. The VCO uses a positive feedback circuit electrically connected to the LC tank for amplifying the sinusoidal wave. In addition, the VCO includes a noise reducing circuit having a T-shaped resistor configuration connected to the positive feedback circuit. The use of the T-shaped resistor configuration allows the VCO to reduce phase noise generated by the LC tank, and provide a high SNR.

31 Claims, 5 Drawing Sheets

US 6,781,471 B2

LOW PHASE NOISE VOLTAGE CONTROLLED OSCILLATOR CIRCUIT

BACKGROUND OF INVENTION

1. Field of the Invention

The invention relates to oscillator circuits, and more particularly to a new circuit structure for reducing the phase noise of an oscillator circuit using an LC tank.

2. Description of the Prior Art

High frequency voltage controlled oscillators (VCO) are widely used in communication systems. A key attribute for VCO circuits is the ability to have low phase noise and high signal to noise ratio (SNR).

In U.S. Pat. No. 6,064,277, an oscillator circuit is described. Please refer to FIG. 1. FIG. 1 is a schematic diagram of a prior art oscillator circuit 10. The prior art oscillator circuit 10 uses a drive circuit 12 to drive an LC tank. The LC tank comprises an inductor L and a capacitor C, and provides sinusoidal oscillation for the oscillator circuit 10. The drive circuit 12 has two passive components Z1 and Z2. Z1 and Z2 may be resistors or inductors. Z1 and Z2 are connected to the bases of biasing transistors Q1 and Q2 respectively. The drive circuit 12 is fed with a bias voltage $V_{BIAS}$, which serves as an anchor voltage for the biasing transistors Q1 and Q2 through Z1 and Z2. Typically, Z1 and Z2 have large resistance values in order to reduce the loading effect on the bias voltage source.

However, the passive components Z1 and Z2 cannot completely block noise introduced by $V_{BIAS}$. Moreover, the large resistance of the passive components Z1 and Z2 will also contribute thermal noise into the oscillator and thus introduce phase noise. As a result, a signal to noise ratio (SNR) of the prior art oscillator circuit 10 is limited.

SUMMARY OF INVENTION

It is therefore a primary objective of the claimed invention to provide a voltage controlled oscillator to solve the above-mentioned problem.

According to the claimed invention, a voltage controlled oscillator (VCO) has an LC tank for generating a sinusoidal wave and a positive feedback circuit electrically connected to the LC tank for amplifying the sinusoidal wave. In addition, the VCO includes a noise reducing circuit comprising a T-shaped resistor configuration connected to the positive feedback circuit. The use of the T-shaped resistor configuration allows the VCO to reduce phase noise generated by the LC tank, and provide a high SNR. Alternatively, the noise reducing circuit can use a delta-shaped resistor configuration instead of the T-shaped resistor configuration. The delta-shaped resistor configuration includes a first resistor connected to the positive feedback circuit for reducing phase noise generated by the LC tank and two second resistors connected to the first resistor for receiving a DC bias voltage.

Another objective of the present invention is to provide a common-mode compensation circuit that can eliminate the common-mode noise in the common node of the LC tank. Using a pair of junction diodes to sense the common-mode signal from the differential output, such compensation circuit can prevent two transistors connected to the LC tank from deep saturation. When the transistors operate in deep saturation mode, a negative compensation is provided to reduce the phase noise.

It is an advantage of the claimed invention that the VCO includes a noise reducing circuit with a T-shaped resistor configuration or a delta-shaped resistor configuration and a compensation circuit to reduce phase noise and provide superior SNR.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
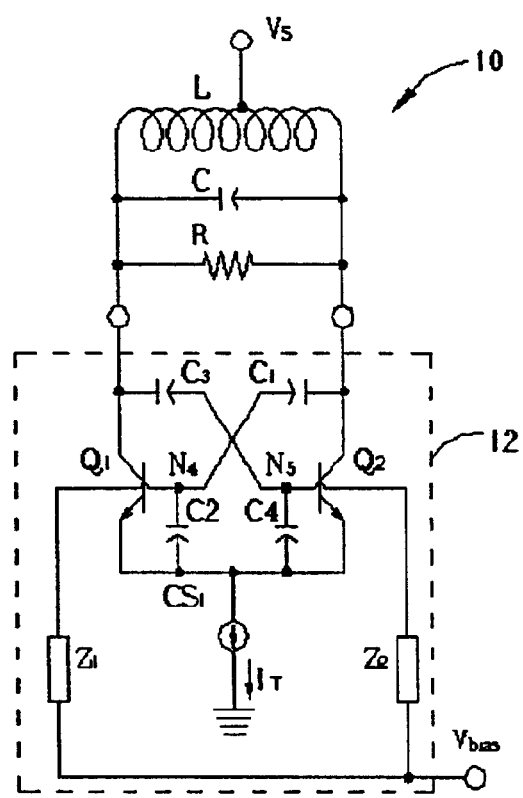
FIG. 1 is a schematic diagram of a prior art oscillator circuit.
Figure 2:
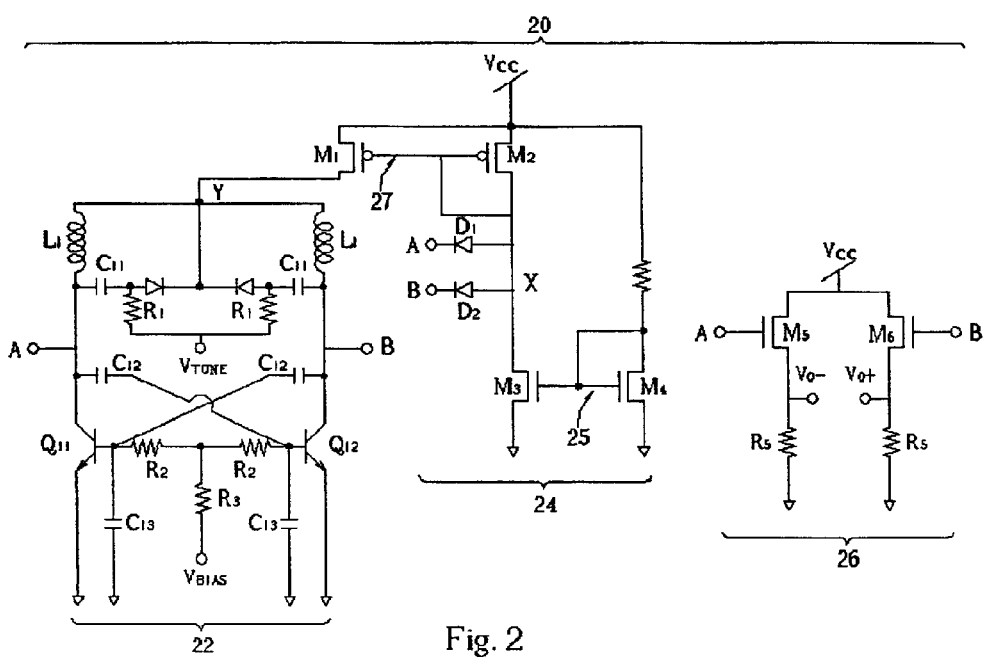
FIG. 2 is a schematic diagram of a voltage controlled oscillator circuit according to the present invention.
Figure 3:
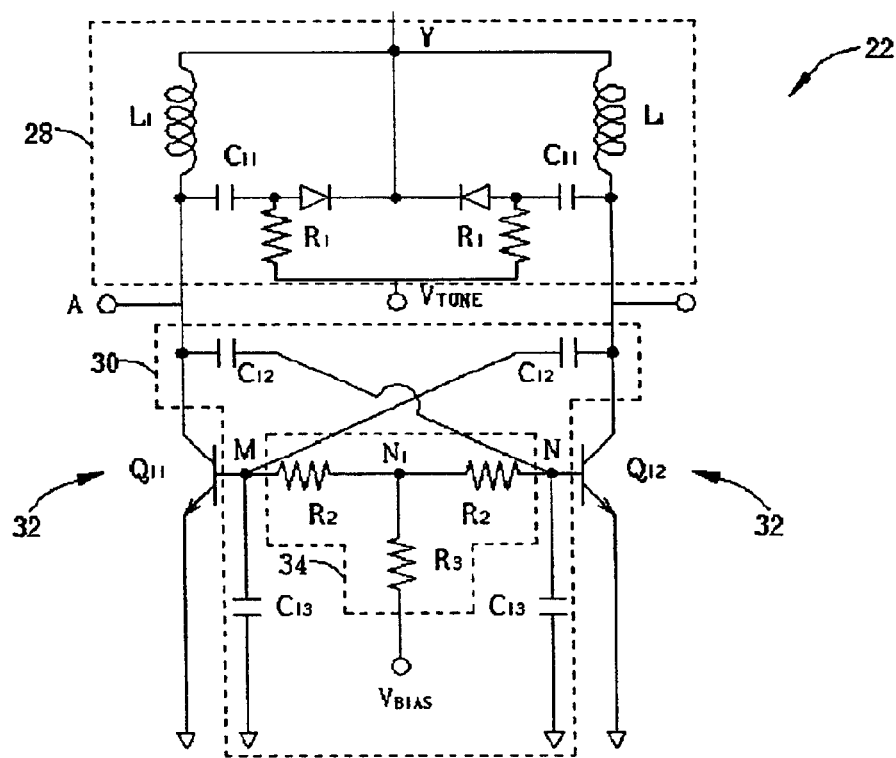
FIG. 3 is a detailed schematic diagram of an oscillator core within the VCO circuit.

Please refer to FIG. 2 and FIG. 3. FIG. 2 is a schematic diagram of a voltage controlled oscillator (VCO) circuit 20 according to the present invention. FIG. 3 is a detailed schematic diagram of an oscillator core 22 within the VCO circuit 20. The oscillator core 22 comprises an LC tank 28 for generating a sinusoidal wave and a noise reducing circuit 30 for reducing phase noise generated by the LC tank 28. In addition, the oscillator core 22 includes a positive feedback circuit 32 electrically connected to both the LC tank 28 and the noise reducing circuit 30 for amplifying the sinusoidal wave.

The positive feedback circuit 32 comprises a differential pair of bipolar junction transistors (BJT) Q11 and Q12, each transistor connected to the LC tank 28 for amplifying the sinusoidal wave generated by the LC tank 28.

The noise reducing circuit 30 further comprises a T-shaped resistor configuration 34 that includes two first resistors R2 and a second resistor R3. Each first resistor R2 is connected to a base of one of the BJTs Q11 and Q12, which are labeled as nodes M and N. The second resistor R3 is connected to the first resistors R2 and to a DC bias voltage source $V_{BIAS}$, which is supplied to the positive feedback circuit 32 through the T-shaped resistor configuration 34.

In addition to reducing phase noise generated by the LC tank 28, the noise reducing circuit 30 also works as an attenuator network for reducing amplitude of the sinusoidal wave. Similar to the prior art oscillator circuit 10, the noise reducing circuit 30 contains two voltage dividers. Each voltage divider is formed by two capacitors C12 and C13. These voltage dividers allow the base voltage swings of BJTs Q11 and Q12 to be attenuated to a lower level than that of the collectors of Q11 and Q12, thus allowing higher voltage swings across the LC tank 28 while preventing Q11 and Q12 from deep saturation condition during the transient period.

Besides the oscillator core 22, the VCO circuit 20 also comprises a common-mode compensation circuit 24 electrically connected to the positive feedback circuit 32 and the LC tank 28. The common-mode compensation circuit 24 is connected to the positive feedback circuit 32 through terminals A and B, and provides a feedback loop. The common-mode compensation circuit 24 has two diodes $D_1$ and $D_2$ for picking up even-harmonic distortion generated by the sinusoidal waveform produced at the differential outputs of the oscillator. Assumed that the current flowing into the node Y of the LC tank 28 increases, causing an increase of the amplitude of the sinusoidal wave generated by the LC tank 28 and an increase of the even-harmonic distortion, the distortion picked up by the diodes $D_1$ and $D_2$ will increase the voltage level of a gate and a drain of the MOS transistor $M_2$. Thus the current generated by the current mirror 27 is forced to be reduced thereby providing a negative compensation to generate a cleaner waveform.

Furthermore, the diodes $D_1$ and $D_2$ are connected to a drain of the MOS transistors $M_3$. When an instantaneous voltage of a collector of the BJT $Q_{11}$, $Q_{12}$ is lower than a voltage level of the drain of the MOS transistor $M_3$ by a predetermined amount, the diode $D_1$, $D_2$ will be turned on to increase the voltage of the collector of the BJT $Q_{11}$, $Q_{12}$, thereby preventing the two BJTs $Q_{11}$, $Q_{12}$ in the positive feedback circuit 32 from deep saturation.

Finally, the VCO circuit 20 also comprises an output buffer 26 electrically connected to the positive feedback circuit 32 through terminals A and B for reducing loading effect of a load placed after the VCO circuit 20. The output buffer 26 works as a source follower for a further isolation of the output load. The T-shaped resistor configuration 34 is an important feature of the present invention. Similar to the prior art, the T-shaped resistor configuration 34 uses a large resistance value to block noise coming from the DC bias voltage source $V_{BIAS}$ and also to prevent noise from entering $V_{BIAS}$. The second resistor R3 provides this large resistance, and is typically in the range of 1,000 to 50,000 ohms. In the present invention, the second resistor R3 is connected to $V_{BIAS}$, and provides the same function as the two passive components Z1 and Z2 in the prior art oscillator circuit 10.

Differing from the prior art, the present invention also uses two matched first resistors R2 with small resistance values to provide superior SNR for the VCO circuit 20. By connecting the first resistors R2 to both the second resistor R3 and to the positive feedback circuit 32, node N1 becomes a virtual ground. Because the first resistors R2 are matched, the first resistors R2 change equivalent input resistances of the BJTs $Q_{11}$, $Q_{12}$, and much better SNR levels are attained over those of the prior art oscillator circuit 10. The resistance values of the first resistors R2 are typically in the range of 10–100 ohms in this embodiment. However, the resistance values of the second resistors R2 may also be in other ranges as long as they are capable of providing excellent isolation for the VCO circuit 20 from the bias voltage source.

Figure 4:
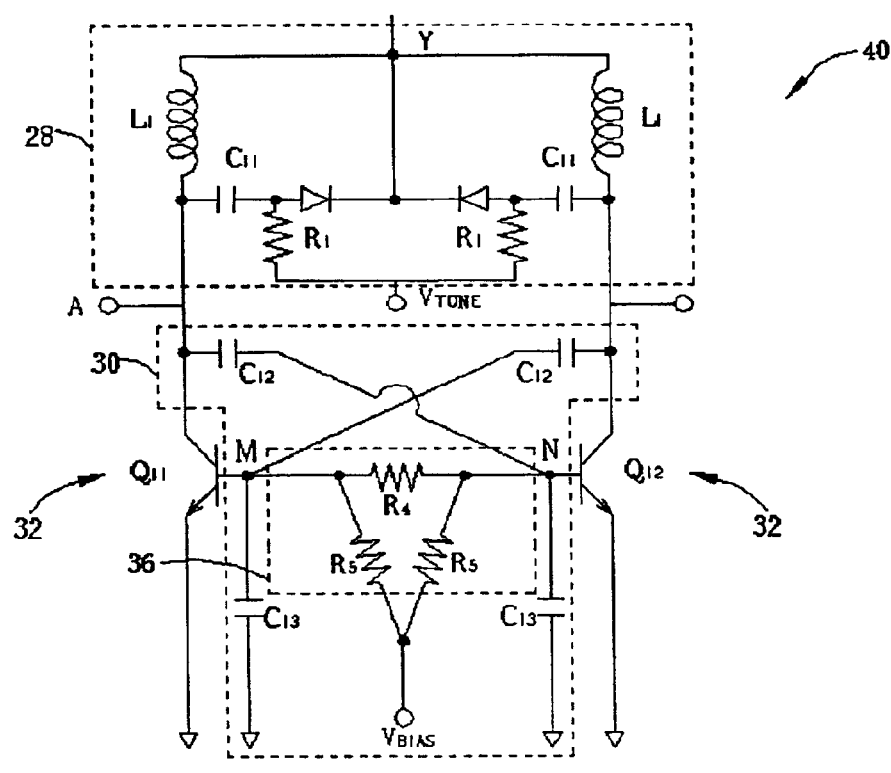
FIG. 4 is a schematic diagram of an oscillator core that uses a delta-shaped resistor configuration.

Please refer to FIG. 4. FIG. 4 is a schematic diagram of an oscillator core 40 that uses a delta-shaped resistor configuration 36. The oscillator core 40 shown in FIG. 4 is identical to the oscillator core 22 from FIG. 3 except that the T-shaped resistor configuration 34 is now replaced with the delta-shaped resistor configuration 36. As is well known in the art, the T-shaped resistor configuration 34 and the delta-shaped resistor configuration 36 are substantially functional equivalents in most cases. Third resistor R4 is connected to nodes M and N. Two fourth resistors R5 are connected to the DC bias voltage source $V_{BIAS}$, with one connected to node M and the other connected to node N.

In the delta-shaped resistor configuration 36, third resistor R4 will have a small resistance, and is similar in function to first resistors R2. That is, first resistor R2 and third resistor R4 are each used for the purpose of providing superior SNR. Likewise, fourth resistors R5 have a large resistance and are similar in function to second resistor R3. Second resistor R3 and fourth resistor R5 are each used to block noise coming from the DC bias voltage source $V_{BIAS}$.

Figure 5:
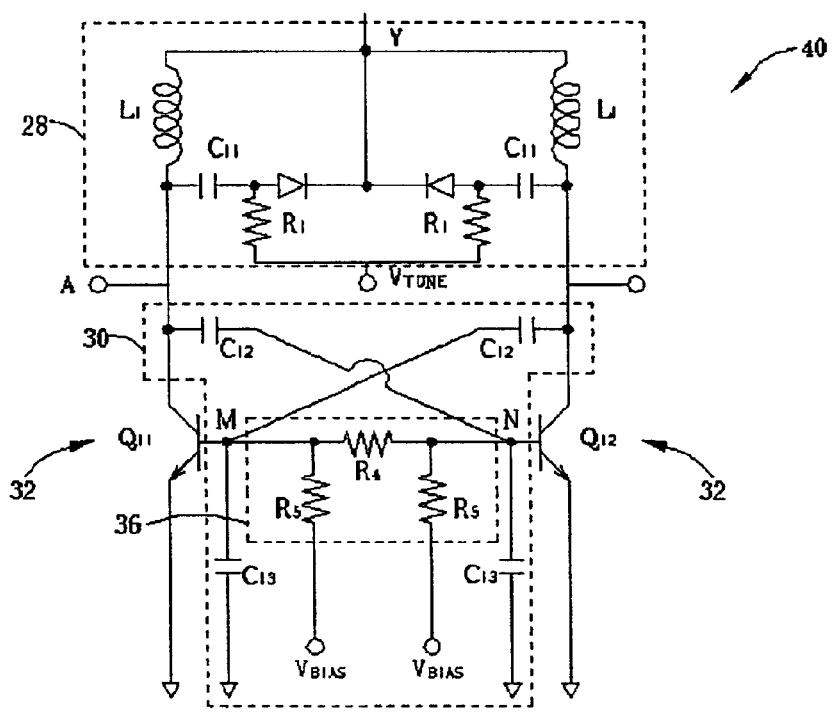
FIG. 5 is the oscillator core shown in FIG. 4 with another representation of the delta-shaped resistor configuration.

FIG. 5 is the oscillator core 40 shown in FIG. 4 with another representation of the delta-shaped resistor configuration 36. FIG. 4 and FIG. 5 are equivalent circuits. FIG. 5 is provided only to show another way of indicating the connection of fourth resistors R5 to $V_{BIAS}$.

Compared to the prior art, the present invention uses the T-shaped resistor configuration 34 with two first resistors R2 in order to provide improved SNR performance for the VCO circuit 20. By adding the first resistors R2 with resistances in the specified range, noise is greatly reduced, making the present invention VCO circuit 20 a much better oscillator than the prior art oscillator circuit 10.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A voltage controlled oscillator comprising:
   an LC tank for generating a sinusoidal wave;
   a positive feedback circuit electrically connected to the LC tank for amplifying the sinusoidal wave;
   a noise reducing circuit comprising a T-shaped resistor configuration connected to the positive feedback circuit for reducing phase noise generated by the LC tank; and
   a common-mode compensation circuit electrically connected to the positive feedback circuit for further reducing the phase noise generated by the LC tank.

2. The voltage controlled oscillator of claim 1 further comprising a current mirror for mirroring a current in the common-mode compensation circuit onto the LC tank.

3. The voltage controlled oscillator of claim 1 further comprising an output buffer electrically connected to the positive feedback circuit for reducing loading effect of a load.

4. The voltage controlled oscillator of claim 3 wherein the output buffer is a source follower.

5. The voltage controlled oscillator of claim 1 wherein the positive feedback circuit comprises a differential pair electrically connected to the LC tank for amplifying the sinusoidal wave, the noise reducing circuit being an attenuator network for reducing amplitude of the sinusoidal wave.

6. The voltage controlled oscillator of claim 5 wherein the noise reducing circuit provides a DC bias voltage for the differential pair.

7. The voltage controlled oscillator of claim 6 wherein the differential pair comprises two bipolar junction transistors.

8. The voltage controlled oscillator of claim 7 wherein the T-shaped resistor configuration comprises two first resistors each connected to a base of one of the bipolar junction transistors, and a second resistor connected to the first resistors for receiving the DC bias voltage.

9. The voltage controlled oscillator of claim 8 wherein each first resistor is between 10–100 ohms, the second resistor being between 1,000 to 50,000 ohms.

10. The voltage controlled oscillator of claim 5 wherein the attenuator network comprises two voltage dividers.

11. A voltage controlled oscillator comprising:
    an LC tank for generating a sinusoidal wave;
    a positive feedback circuit electrically connected to the LC tank for amplifying the sinusoidal wave; and
    a noise reducing circuit comprising a first resistor connected to the positive feedback circuit for reducing phase noise generated by the LC tank, and two second resistors connected to the first resistor for receiving a DC bias voltage.

12. The voltage controlled oscillator of claim 11 further comprising a common-mode compensation circuit electrically connected to the positive feedback circuit for further reducing the phase noise generated by the LC tank.

13. The voltage controlled oscillator of claim 12 further comprising a current mirror for mirroring a current in the common-mode compensation circuit onto the DC tank.

14. The voltage controlled oscillator of claim 11 further comprising an output buffer electrically connected to the positive feedback circuit for reducing loading effect of a load.

15. The voltage controlled oscillator of claim 14 wherein the output buffer is a source follower.

16. The voltage controlled oscillator of claim 11 wherein the positive feedback circuit comprises a differential pair electrically connected to the LC tank for amplifying the sinusoidal wave, the noise reducing circuit being an attenuator network for reducing amplitude of the sinusoidal wave, the DC bias voltage being provided for the differential pair.

17. The voltage controlled oscillator of claim 16 wherein the differential pair comprises two bipolar junction transistors.

18. The voltage controlled oscillator of claim 17 wherein the first resistor is connected to bases of the bipolar junction transistors.

19. The voltage controlled oscillator of claim 11 wherein the first resistor is between 10–100 ohms, each second resistor being between 1,000 to 50,000 ohms.

20. The voltage controlled oscillator of claim 16 wherein the attenuator network comprises two voltage dividers.

21. A voltage controlled oscillator comprising:

an LC tank for generating a sinusoidal wave;

two bipolar junction transistors electrically connected to the LC tank for amplifying the sinusoidal wave;

two voltage dividers for reducing amplitude of the sinusoidal wave;

two first resistors each connected to a base of one of the bipolar junction transistors for reducing phase noise generated by the LC tank;

a second resistor connected to the first resistors for receiving a DC bias voltage;

a common-mode compensation circuit electrically connected to collectors of the bipolar junction transistors for further reducing the phase noise generated by the LC tank;

a current mirror for mirroring a current in the common-mode compensation circuit onto the LC tank; and a source follower electrically connected to the collectors of the bipolar junction transistors for reducing loading effect of a load.

22. A voltage controlled oscillator comprising:

an LC tank for generating a sinusoidal wave;

a positive feedback circuit electrically connected to the LC tank for amplifying the sinusoidal wave;

a noise reducing circuit comprising a T-shaped resistor configuration connected to the positive feedback circuit for reducing phase noise generated by the LC tank; and an output buffer electrically connected to the positive feedback circuit for reducing a loading effect of a load.

23. The voltage controlled oscillator of claim 22 further comprising a common-mode compensation circuit electrically connected to the positive feedback circuit for further reducing the phase noise generated by the LC tank.

24. The voltage controlled oscillator of claim 23 further comprising a current mirror for mirroring a current in the common-mode compensation circuit onto the LC tank.

25. The voltage controlled oscillator of claim 22 wherein the output buffer is a source follower.

26. The voltage controlled oscillator of claim 22 wherein the positive feedback circuit comprises a differential pair electrically connected to the LC tank for amplifying the sinusoidal wave, the noise reducing circuit being an attenuator network for reducing amplitude of the sinusoidal wave.

27. The voltage controlled oscillator of claim 26 wherein the noise reducing circuit provides a DC bias voltage for the differential pair.

28. The voltage controlled oscillator of claim 27 wherein the differential pair comprises two bipolar junction transistors.

29. The voltage controlled oscillator of claim 28 wherein the T-shaped resistor configuration comprises two first resistors each connected to a base of one of the bipolar junction transistors, and a second resistor connected to the first resistors for receiving the DC bias voltage.

30. The voltage controlled oscillator of claim 29 wherein each first resistor is between 10–100 ohms, the second resistor being between 1,000 to 50,000 ohms.

31. The voltage controlled oscillator of claim 26 wherein the attenuator network comprises two voltage dividers.

* * * * *